US006835642B2

(12) United States Patent
Yang et al.

(10) Patent No.: US 6,835,642 B2
(45) Date of Patent: Dec. 28, 2004

(54) METHOD OF FORMING A METAL FUSE ON SEMICONDUCTOR DEVICES

(75) Inventors: Chao-Hsiang Yang, Hsin-chu (TW); Chun-Ming Su, Pingjen (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 0 days.

(21) Appl. No.: 10/323,350

(22) Filed: Dec. 18, 2002

(65) Prior Publication Data

US 2004/0119138 A1 Jun. 24, 2004

(51) Int. Cl.[7] .............................................. H01L 21/44
(52) U.S. Cl. ...................... 438/601; 438/132; 438/281; 438/618
(58) Field of Search ............................... 438/132, 281, 438/601, 618, 6; 257/529

(56) References Cited

U.S. PATENT DOCUMENTS

| | | | | |
|---|---|---|---|---|
| 6,100,118 A | * | 8/2000 | Shih et al. ................... | 438/132 |
| 6,177,297 B1 | * | 1/2001 | Chen et al. .................. | 438/132 |
| 6,180,503 B1 | * | 1/2001 | Tzeng et al. ................. | 438/601 |
| 6,288,436 B1 | * | 9/2001 | Narayan et al. ............. | 257/529 |
| 6,687,973 B2 | * | 2/2004 | Hewson et al. ............. | 29/592.1 |
| 6,753,244 B2 | * | 6/2004 | Wu et al. .................... | 438/601 |

* cited by examiner

Primary Examiner—David Nelms
Assistant Examiner—Dao H. Nguyen
(74) Attorney, Agent, or Firm—Tung & Associates

(57) ABSTRACT

A method of forming a metal fuse in a semiconductor device. In one embodiment, a specific additional mask is applied to form the metal fuse to reduce the thickness of the fuse. The method also includes forming a fuse window opening that is very shallow in the semiconductor device. The shallower opening allows for better control and removal of the remaining passivation left over the fuse during a fuse burning laser process. The thinner fuse and the thinner remaining passivation reduce the amount of laser energy required to vaporize the oxide and to cut the fuse. The location of the fuse also greatly enlarges the laser energy window that can be utilized to make laser repairs. The larger energy window results in a higher laser repair success ratio even if some deviation in the fabrication process occurs.

41 Claims, 15 Drawing Sheets

METHOD OF FORMING A METAL FUSE ON SEMICONDUCTOR DEVICES

FIELD OF THE INVENTION

This invention relates to a method of forming a metal fuse, and more particularly to a method of forming a metal fuse on or in a semiconductor device.

BACKGROUND OF THE INVENTION

It is known to use fuses for circuit repair of semiconductor devices. For example, as the memory device or the device with an embedded memory, the defective memory cells can be replaced by blowing the related fuses with the redundancy row or column of the cells. So the yield of the memory devices can be improved. Also, logic devices can be repaired or reconfigured by blowing such fuses. For example, it is common to initially fabricate a generic logic chip having a large number of interconnected logic gates. Thereafter, in a final processing step, the chip is customized to perform the desired circuitry by blowing fuses.

Conventional metal fuses are formed on the penultimate, antepenultimate or deeper layer. The thickness of the oxide remaining over the fuse links is difficult to control using etching technology, particularly in processes wherein the devices are manufactured with thinner and thinner layers. The thick oxide remaining over the fuse causes at least two problems. The first problem is that a higher laser energy is needed to penetrate the remaining oxide in order to cut the fuse links. The higher laser energy may result in micro-cracking of the inter-metal dielectric layer, so that the reliability of the device is decreased. The second problem is that the remaining fuse link causes the failure of the laser repair when an insufficient amount of laser energy is utilized. Further, moisture and other contaminants can diffuse through the deep opening in such devices in the area where the fuse is located.

FIGS. 1A–B illustrate a prior art method of forming a conventional copper metal fuse and blowing the same. FIG. 1A is a cross sectional view of a conventional copper metal fuse semiconductor device. The copper metal fuse semiconductor device is provided by forming a conductive layer 22, such as a polysilicon layer, above the semiconductor substrate 10 and an isolation oxide layer 20. Then a first inter-level dielectric (ILD) layer 30 is formed and covers the entire substrate. Then an electrically conductive plug 32 is formed inside the first ILD layer 30. Thereafter, a copper metal conductive layer (first metallization layer) 34 is formed inside the first ILD layer 30 and makes electrical contact with the conductive plug 32.

Next, a first inter-metal dielectric (IMD) layer 40 is formed covering the first metallization layer 34 and the first ILD layer 30. Then a conductive plug 42 is formed inside the first IMD layer 40. Thereafter, a second metallization layer 44 is formed inside the first IMD layer 40 and makes electrical contact with the conductive plug 42.

Next, a second IMD layer 50 is formed covering the second metallization layer 44 and the first IMD layer 40. Then a conductive plug 52 is formed inside the second IMD layer 50. Thereafter, a third metallization layer 54 is formed inside the second IMD layer 50.

Next, a third IMD layer 60, conductive plug, 62 and fourth metallization layer 64 are made in a similar manner as described above. Likewise, a fourth IMD layer 70, conductive plug 72 and fifth metallization layer 76 are made in a similar manner as described above.

Next, a first passivation layer 92 such as silicon dioxide is formed over the fourth IMD layer 70 and fourth metallization layer 74. A second passivation layer 94, such as silicon nitride, may also be formed over the first passivation layer 92. Thereafter, conventional photolithography and etching techniques are used to pattern the passivation layers 92 and 94 and to open a fuse window 96. The IMD layer 60, typically silicon dioxide, is etched back over the fuse 56 to leave a dielectric layer 66 over the fuse 56 as shown in FIG. 1A.

Next the electrical probe test is performed to decide if the device cells or circuits need to be repaired. Thereafter, a laser beam 97 is emitted through the opening of the fuse window 96 and penetrates the remaining portion of the IMD layer (silicon dioxide) 66 to perform the laser repair. Thereafter, as shown in FIG. 1B, the fuse 56 is cut open by the laser beam. An opening 98 exposes the IMD layer 50 after the laser repair.

The fuse 56 is formed with the same mask as the conductive layer (third metallization layer) 54 so that thickness of the fuse 56 is the same as the conductive layer 54. A thinner fuse cannot be produced using this prior art method.

In the conventional method of fabricating such a fuse, as shown in the prior art FIGS. 1A–B, the fuse 56 is positioned deep below the surface of the device. Therefore, the laser energy must be substantially high to implement the laser repair. Still further, when the fuse 56 is positioned too deep in the structure, it is difficult for the laser beam to reach a focal point without part of the laser beam being dispersed. Hence, a substantial amount of the laser power is wasted. Typically, in response, a higher laser power is applied in an effort to provide a higher repair rate. However, turning up the laser power can easily damage part of the device area, for example by causing micro-cracking, and thus reduces the reliability of the process. Because of the very narrow window provided when the fuse is located in a position very deep within the device, it becomes difficult to vaporize the remaining oxide 66. When the thickness of the remaining oxide 66 is too thick, a greater amount of laser energy is required to blow the fuse and it is easy to cause the micro-cracking. However, if a lower laser energy is utilized to prevent micro-cracking, the fuse may not be sufficiently or completely cut. As a consequence, the laser energy window is very narrow in these prior art processes and devices. The present invention provides an improved method of forming a fuse on a semiconductor device, and in one embodiment forming a fuse on a semiconductor device produced using copper metallization techniques.

SUMMARY OF THE INVENTION

One embodiment of the invention includes a method of forming a metal fuse on the top metal conductive layer of a semiconductor device. Generally, the top metal conductive layer is thicker than the other metal conductive layers (metallization layers) in a semiconductor device. The present invention provides a method to reduce the thickness of the top metal fuse. In one embodiment, a specific additional mask is applied to form the metal fuse to reduce the thickness of the fuse. The method also includes forming a fuse window opening that is very shallow in the semiconductor device. The shallower opening allows for better control and removal of the remaining oxide left over the fuse during a fuse burning laser process. The thinner fuse and the thinner remaining oxide reduce the amount of laser energy required to vaporize the oxide and to cut the fuse. The location of the fuse also greatly enlarges the laser energy window that can be utilized to make laser repairs. The larger energy window results in a higher laser repair success ratio even if some deviation in the fabrication process occurs. Furthermore, device micro-cracking abnormality caused by using larger amounts of laser energy can be avoided. The prior art tendency to leave a metal fuse link as a result of using insufficient laser energy is also avoided.

Another embodiment of the invention includes a semiconductor device comprising:

a silicon based substrate, and a metallization layer overlying the silicon based substrate and a fuse portion, the metallization layer and the fuse portion being received in a dielectric layer, and the metallization layer having a thickness of at least 9000 angstroms, and the fuse portion having a thickness less than 4500 angstroms.

Another embodiment of the invention includes a method of making a semiconductor device having a thin fuse portion comprising: forming a first mask over a semiconductor device having a first metallization layer overlying a silicon based substrate and at least a first inter-metal dielectric layer overlying the first metallization layer, and wherein the first mask has an opening formed therein aligned with a portion of the first metallization layer;

etching through the first inter-metal dielectric layer down to the first metallization layer and removing the first mask to provide a first via through the first inter-metal dielectric layer down to the first metallization layer; forming a second mask over the semiconductor wafer and down into the first via formed through the first inter-metal dielectric layer, and etching a top portion of the second mask to leave a temporary plug in the first via in the first inter-metal dielectric layer; forming a third mask over the semiconductor wafer and into the via formed in the first inter-metal dielectric layer and on top of the temporary plug, and wherein the third mask has an opening therein spaced laterally a distance away from the temporary plug; etching a portion of the first inter-metal dielectric layer to form a shallow via therein to receive an electrically conductive material to form a fuse portion, and removing the third mask; forming a fourth mask over the semiconductor wafer and into the shallow via formed in the first inter-metal dielectric layer, and the fourth mask having an opening therein aligned with the temporary plug, etching a portion of the semiconductor wafer through the opening in the fourth mask to remove at least a portion of the first inter-metal dielectric layer and the temporary plug to provide a via down to the first metallization layer; forming an electrically conductive material over the semiconductor wafer and into the via down to the first metallization layer, and into the shallow via formed in the first inter-metal dielectric layer; removing a top portion of the electrically conductive material to form a second metallization layer and a plug extending down to the first metallization layer, and a fuse portion having a thickness less than the second metallization layer.

Another embodiment of the invention includes a method of making a semiconductor device having a thin fuse portion comprising: forming a first mask over a semiconductor device having a first metallization layer over a silicon based substrate and at least a first inter-metal dielectric layer overlying the first metallization layer and a second inter-metal dielectric layer overlying the first inter-metal dielectric layer, and wherein the first mask has an opening formed therein aligned with a portion of the first metallization layer; etching through the first and second inter-metal dielectric layers down to the first metallization layer and removing the first mask to provide a first via through the first inter-metal dielectric layer down to the first metallization layer; forming a second mask over the semiconductor wafer and down into the first via form through the first and second inter-metal dielectric layers, and etching a top portion of the second mask to leave a temporary plug in the first via in the first inter-metal dielectric layer; forming a third mask over the semiconductor wafer and into the first via formed in the first and second inter-metal dielectric layers and on top of the temporary plug, and wherein the third mask has an opening therein spaced laterally a distance away from the temporary plug; etching a portion of the second dielectric layer to form a shallow via therein to receive an electrically conductive material to form a fuse portion, and removing the third mask; forming a fourth mask over the semiconductor wafer and into the shallow via formed in the second inter-metal dielectric layer, and the fourth mask having an opening therein aligned with the temporary plug, and etching a portion of the semiconductor wafer through the opening in the fourth mask to remove at least a portion of the second inter-metal dielectric layer and the temporary plug to provide a via down to the first metallization layer; forming an electrically conductive material over the semiconductor wafer and into the via down to the first metallization layer and into the shallow via formed in the second inter-metal dielectric layer; removing a top portion of the electrically conductive material to form a second metallization layer and a plug extending down to the first metallization layer, and a fuse portion having a thickness less than the second metallization layer.

These and other embodiments of the present invention will become apparent from the following brief description of the drawings, detailed description of the preferred embodiments, and appended claims and drawings.

DETAILED DESCRIPTION OF THE PREFERRED EMBODIMENTS

Figure 1A:
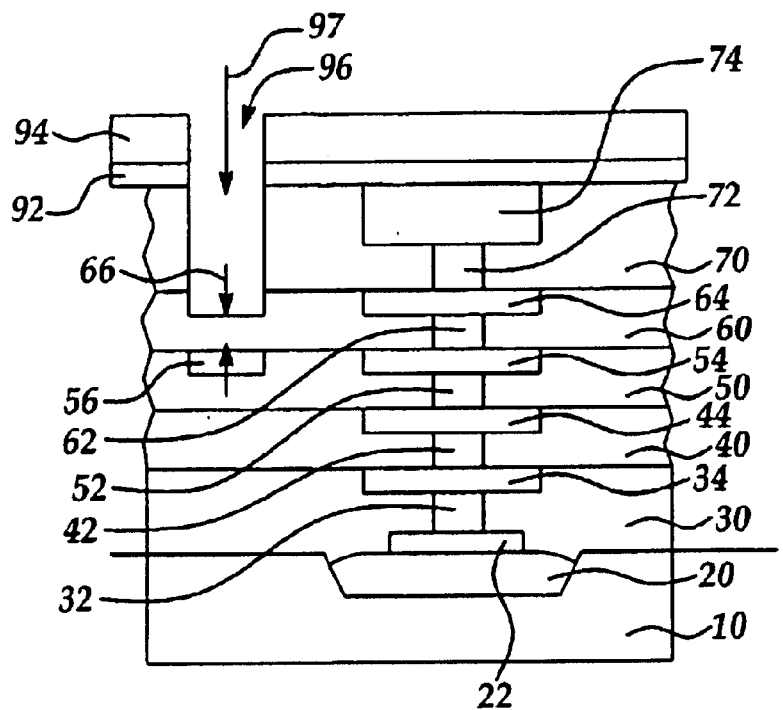
FIG. 1A illustrates a prior art method including forming a fuse window in a semiconductor device.
Figure 1B:
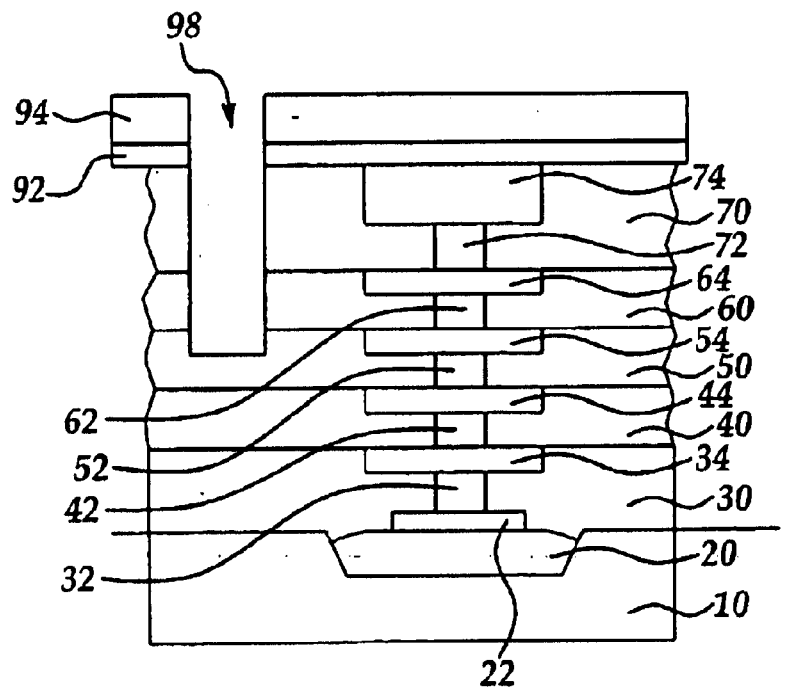
FIG. 1B illustrates a prior art method including cutting a fuse in the semiconductor device shown in FIG. 1A.
Figure 2A:
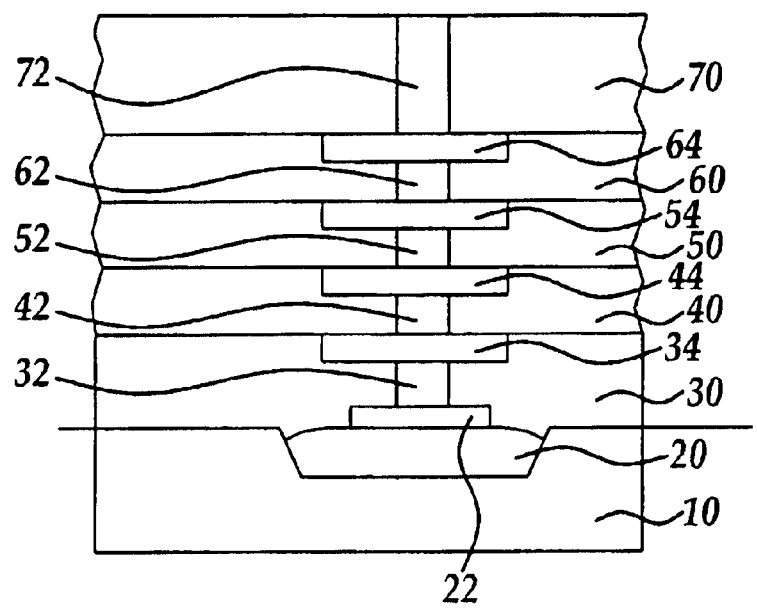
FIG. 2A illustrates a method according to the present invention of providing a semiconductor device including a plurality of dielectric and metallization layers.

FIGS. 2A–F illustrate a method according to the present invention including forming a metal fuse and blowing the same. FIG. 2A is a cross sectional view of a semiconductor device according to the present invention. The semiconductor device is provided by forming a conductive layer 22, such as a polysilicon layer, above a semiconductor substrate 10 and an isolation oxide layer 20. Alternative embodiments of the conductive layer 22 may include polycide, Ti silicide, amorphous silicide or cobalt silicide. Then a first inter-level dielectric (ILD) layer 30 is formed and covers the entire substrate. Then an electrically conductive plug 32 is formed inside the ILD layer 30. Thereafter, a metal conductive layer (first metallization layer) 34 is formed inside the ILD layer 30 and makes electrical contact with the conductive plug 32. In one embodiment the metallization layers and plug may include copper and may be made of a continuous structure that may be deposited in a single step or multiple steps. Dependent upon device demand, a first IMD layer, and a second metallization layer through a nth–1 IMD layer (the IMD furthest from the substrate 10) and a n-th metallization layer (the metallization layer furthest from the substrate 10) may be formed for example in a manner as described with respect to FIG. 1A. The n-th metallization layer is a top metallization layer of the device. In one embodiment the first 40 through (n–2) IMD layer 60 is made from a low dielectric constant material (i.e., a material having a dielectric constant less than that of silicon dioxide) which is particularly suitable if the metallization layers includes copper. The nth–1 IMD layer 70 may be made from silicon dioxide. For example, the following additional dielectric layers and metallization layers may be provided.

Next, a first IMD layer 40 is formed covering the first metallization layer 34 and the first ILD layer 30. Then a conductive plug 42 is formed inside the first IMD layer 40. Thereafter, a second metallization layer 44 is formed inside the first IMD layer 40 and makes electrical contact with the conductive plug 42.

Next, a second IMD layer 50 is formed covering the second metallization layer 44 and the first IMD layer 40. Then a conductive plug 52 is formed inside the second MD layer 50. Thereafter, a third metallization layer 54 is formed inside the second IMD layer 50 and is electrically connected to the plug 52.

Next the third IMD layer 60 is formed covering the third metallization layer 54 and the second IMD layer 50. Then a conductive plug 62 is formed inside the third IMD layer 60. Thereafter a fourth metallization layer 64 is formed inside of the third IMD layer 60.

Figure 2B:
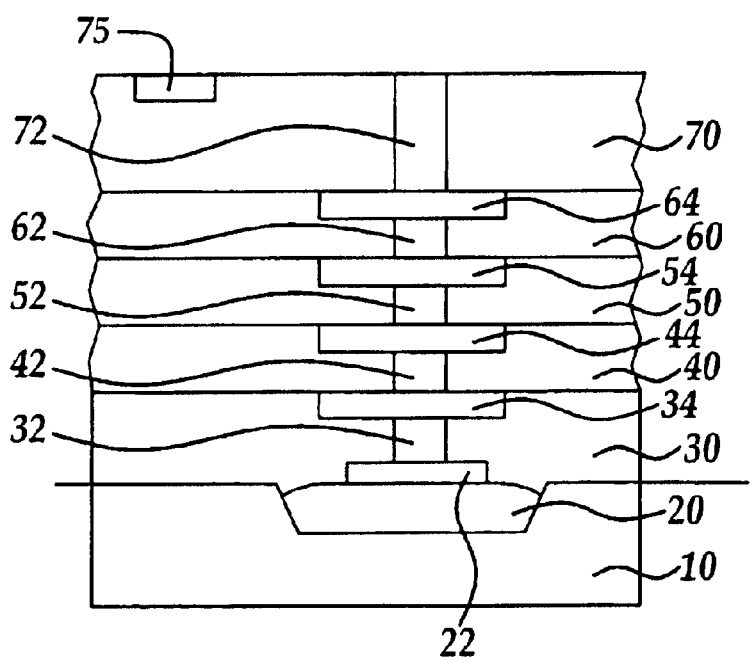
FIG. 2B illustrates a method according to the present invention of forming a metal fuse in a top dielectric layer of a semiconductor device.
Figure 2C:
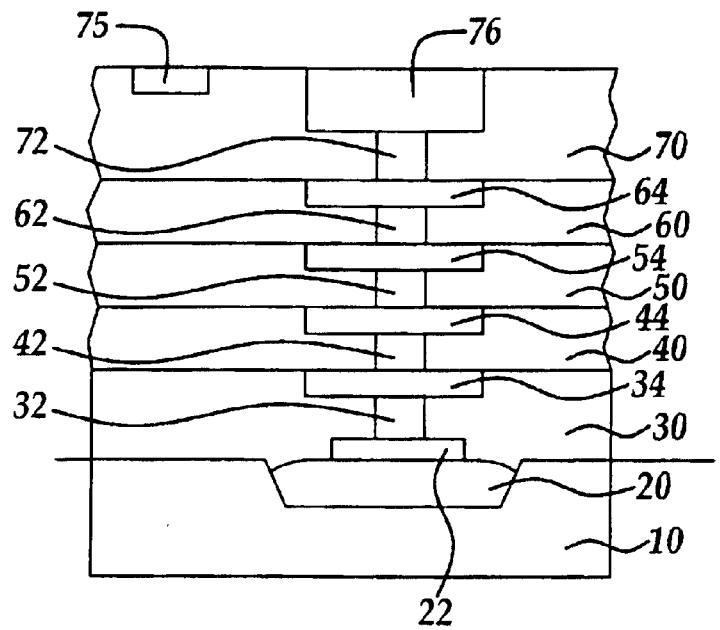
FIG. 2C illustrates a method including the forming a top metallization layer in the semiconductor device shown in FIG. 2B.

Next a top IMD layer (nth-1) 70 is formed covering the fourth metallization layer 54 and the third IMD layer 60. Thereafter, a specific additional mask for the fuse is applied to the top IMD layer 70, and the exposed portion of the MD layer 70 is etched and an electrically conductive material such as copper is deposited into the opening formed in the IMD layer 70 to form a relatively thin metal fuse 75 inside the IMD layer 70 as shown in FIG. 2B. Next, the top copper metal conductive layer 76 is formed using a mask with an opening therein and the exposed portion of the IMD layer 70 is etched followed by deposition of copper into the etched opening in the IMD layer 70 in a manner known to those skilled in the art as shown in FIG. 2C. The top conductive layer 76 may be more than 8000 angstroms thicker than the metal fuse 75. The fact that the metal fuse 75 is much thinner, allows for a much lower amount of laser energy required and best prevents the possibility of significant damage such as micro-cracking of the device.

Figure 2D:
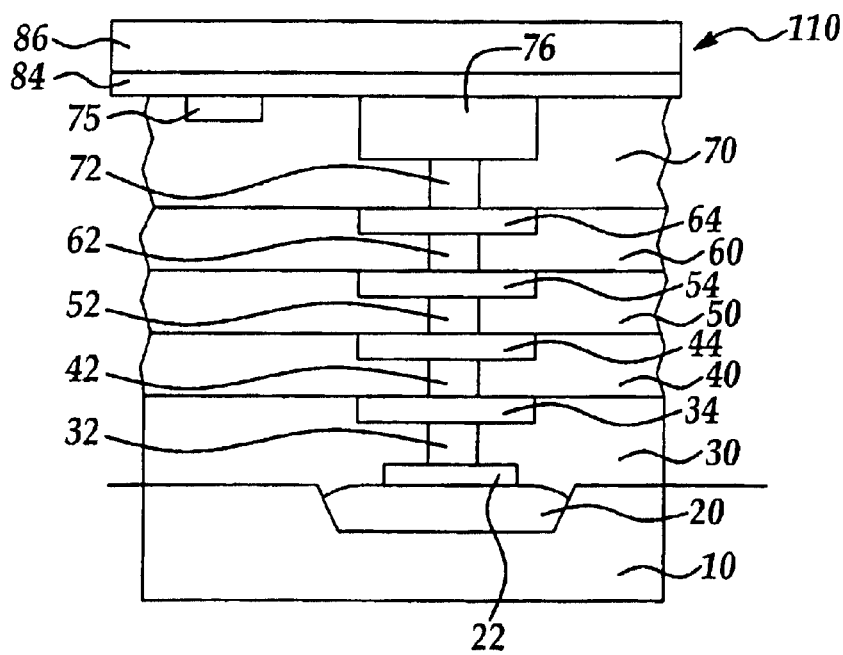
FIG. 2D illustrates a method including forming a passivation blanket over the semiconductor device shown in FIG. 2C.

Next, as shown in FIG. 2D, a passivation blanket 110 is formed over the top IMD layer 70 and the top metallization layer 76 and the metal fuse 75. The passivation blanket 110 includes at least one passivation layer and may include at least two passivation layers 84, 86 which may comprise silicon dioxide, and silicon nitride respectively.

Figure 2E:
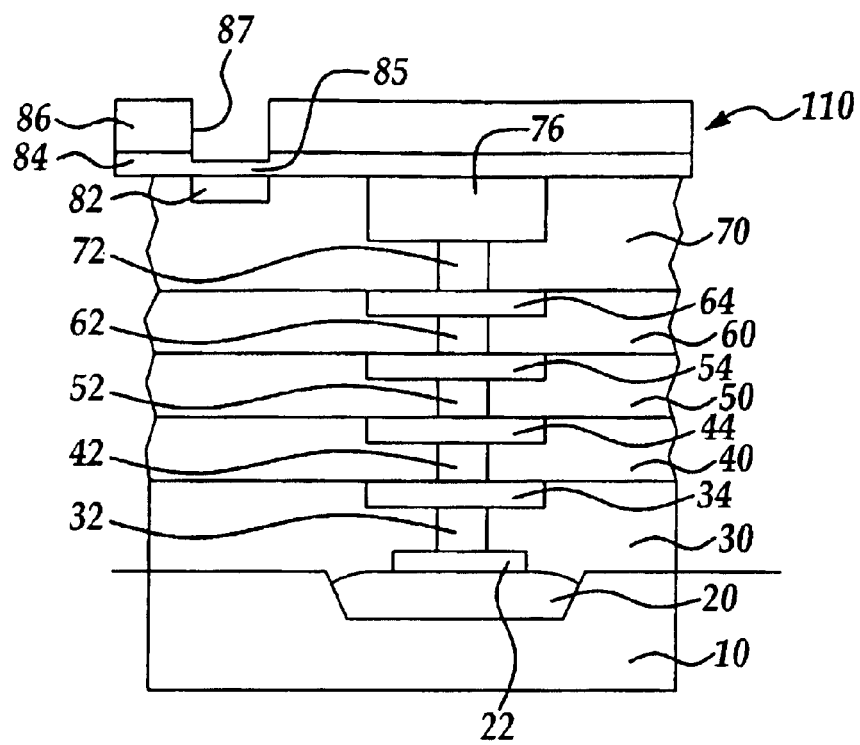
FIG. 2E illustrates forming a fuse window in the passivation blanket of the device shown in FIG. 2D.
Figure 2F:
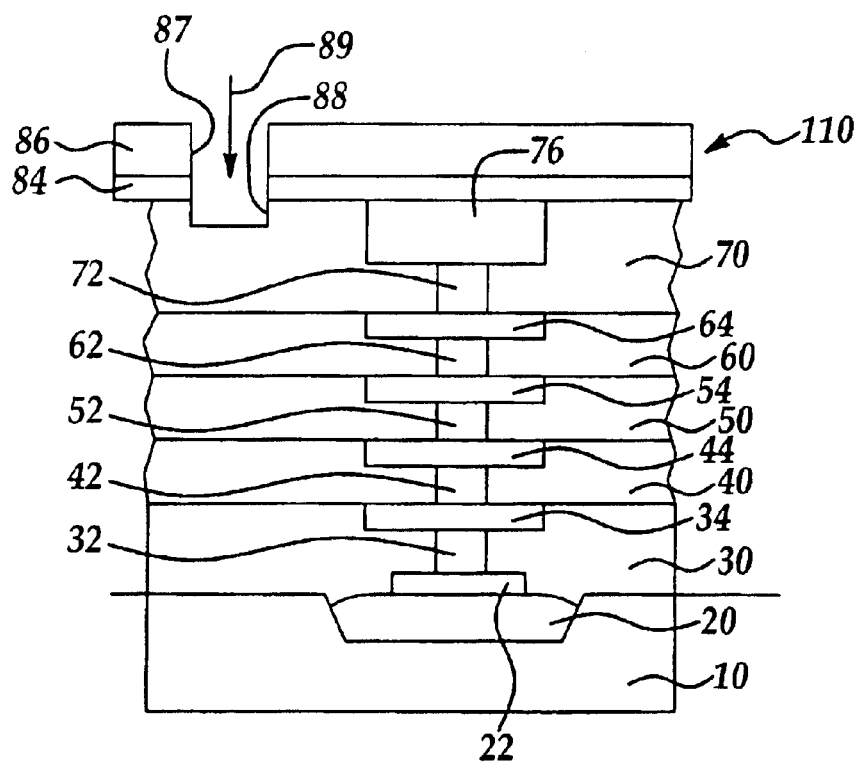
FIG. 2F illustrates a method including cutting a fuse in the semiconductor device shown in FIG. 2E.

Next, as shown in FIG. 2D, conventional photo lithographic and etching techniques may be used to pattern the passivation layers 84, 86 to open a fuse window 87 therein. Since the fuse window 87 is much shallower than those of the prior art, the thickness of the remaining oxide 85 over the fuse 75 can be moderated and controlled within a narrow window. Thereafter, the electrical probing test is performed to decide whether defective cells or circuits need to be repaired. A laser beam 89 is emitted through the opening in the fuse window 87 and penetrates through the remaining oxide 85 to perform the laser repair. Next, as shown in FIG. 2E, the fuse is cut open by the laser beam. An opening 88 exposes the IMD layer 70 which is formed after the laser repair.

Figure 3A:
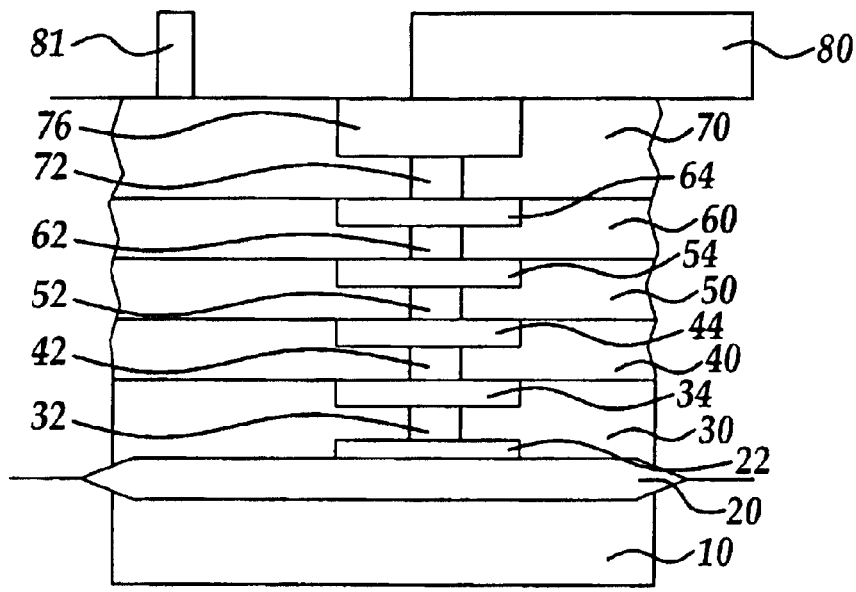
FIG. 3A illustrates a method of forming a probing test pad and metal fuse pre-structure on a semiconductor device having a plurality of dielectric layers and metallization layers according to the present invention.
Figure 3B:
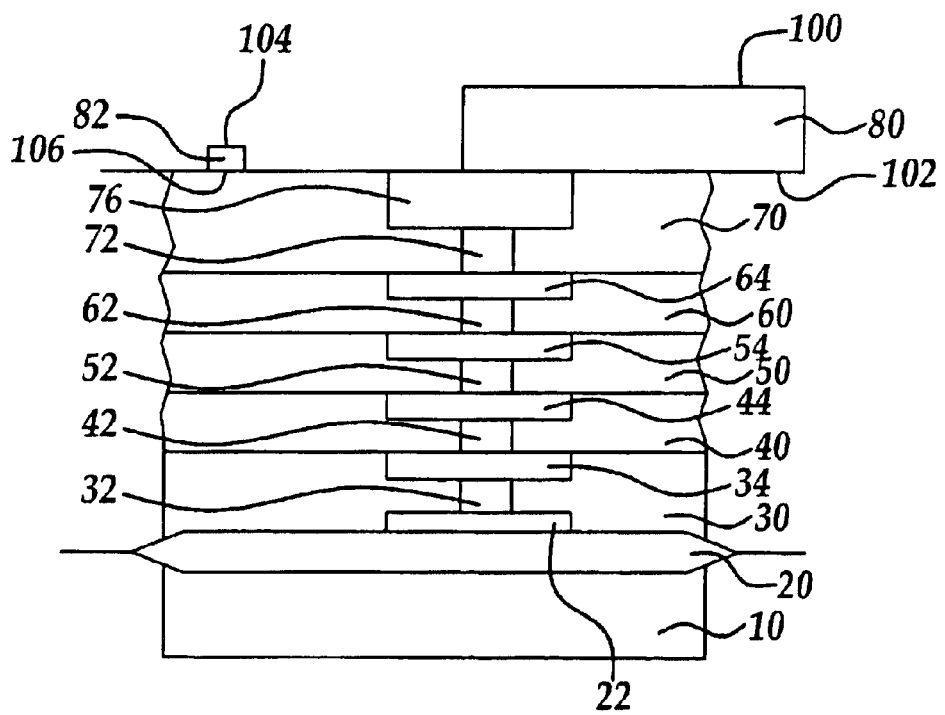
FIG. 3B illustrates a method of etching back a portion of the metal fuse pre-structure to form a metal fuse over the top dielectric layer of a semiconductor device according to the present invention.

FIGS. 3A–F illustrate another embodiment of the present invention which includes a method of forming a metal fuse over the top dielectric and metallization layers. FIG. 3A illustrates a semiconductor device similar to that shown in FIG. 2C, however the device shown in FIG. 3A only has a conductive plug 72 and a top metallization metallization layer 76 formed in the top IMD layer 70. A metal fuse is not formed in the top IMD layer 70. Instead, over the copper process upper metallization layer 76 and IMD layer 70, an aluminum pad 80 and an aluminum fuse pre-structure 81 are formed for electrical probing test and laser repair of the circuit. The aluminum pad 80 and the aluminum fuse pre-structure 81 may be formed over the metallization layer 76 and IMD 70 by any method known to those skilled in the art including for example, forming a sacrificial layer with openings formed therein over the metallization layer 76 and IMD 70. Aluminum may be deposited into the openings in the sacrificial layer by any method known to those skilled in the art including screen printing, electroplating, sputtering, and electroless plating. The sacrificial layer is then removed leaving the aluminum pad 80 and aluminum fuse pre-structure 81 as shown in FIG. 3A. A second mask is then placed over the aluminum pad 80 and with an opening formed therein overlying the aluminum fuse pre-structure 81. The aluminum fuse pre-structure 81 is etched back to the much thinner thickness to produce an aluminum fuse 82 shown in FIG. 3B. In the structure shown in FIG. 3B, the aluminum pad 80 has a thickness (as measured from a top surface 100 furthest from the substrate 10 to a bottom surface 102 nearest the substrate 10) which is substantially greater than the thickness (as measured from a top surface 104 and furthest from the substrate 10 to a bottom surface 106 nearest the substrate 10) of the aluminum fuse 82. In one embodiment the pad 80 has a thickness of at least 8,000 angstroms. In another embodiment the aluminum pad 80 is at least three times as thick as the aluminum fuse 82.

Figures 3C, 3D:
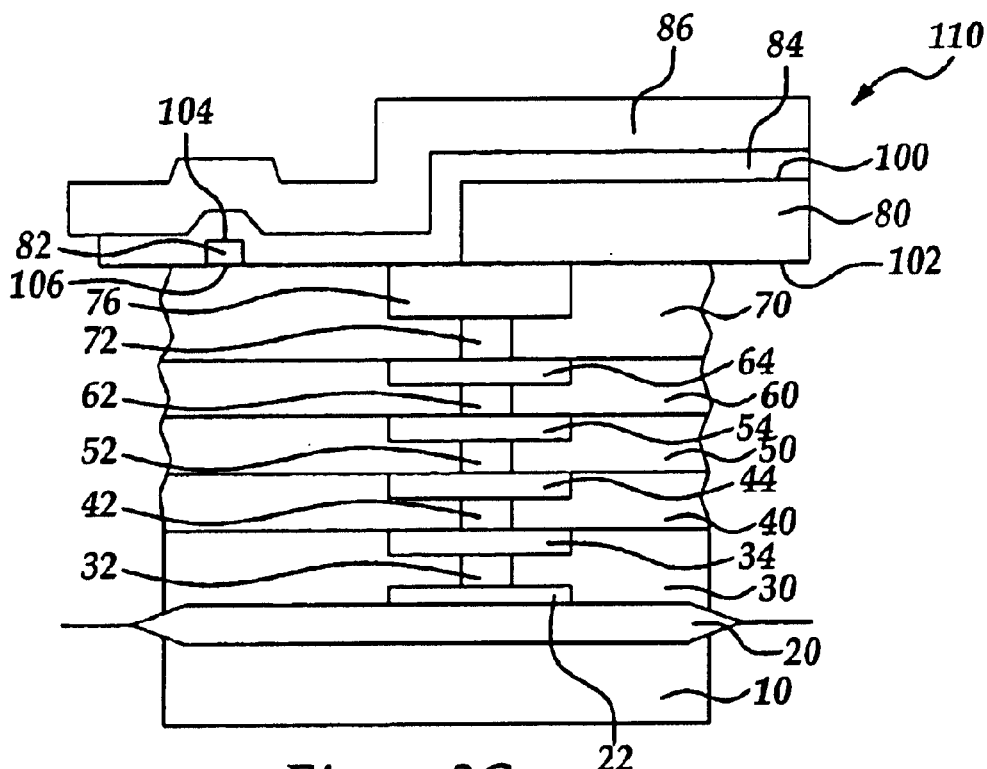
FIG. 3C illustrates a method of forming a passivation blanket over the semiconductor device shown in FIG. 3B.
FIG. 3D illustrates a method of removing a portion of the passivation blanket to expose at least a portion of the probing test pad of the semiconductor device shown in FIG. 3C.

Next, as shown in FIG. 3C, a passivation blanket 110 is formed over the IMD layer 70, and the top metallization layer 76 and the aluminum pad 80. The passivation blanket 110 includes at least one passivation layer, and may include two passivation layers, 84, 86 which may be a silicon oxide layer and a silicon nitride layer respectively.

Next, as shown in FIG. 3D, conventional photolithography and etching techniques are used to pattern the passivation layers 84, 86 selectively removing a portion thereof to expose a portion of the aluminum pad 80 for electrical probing test.

Figure 3E:
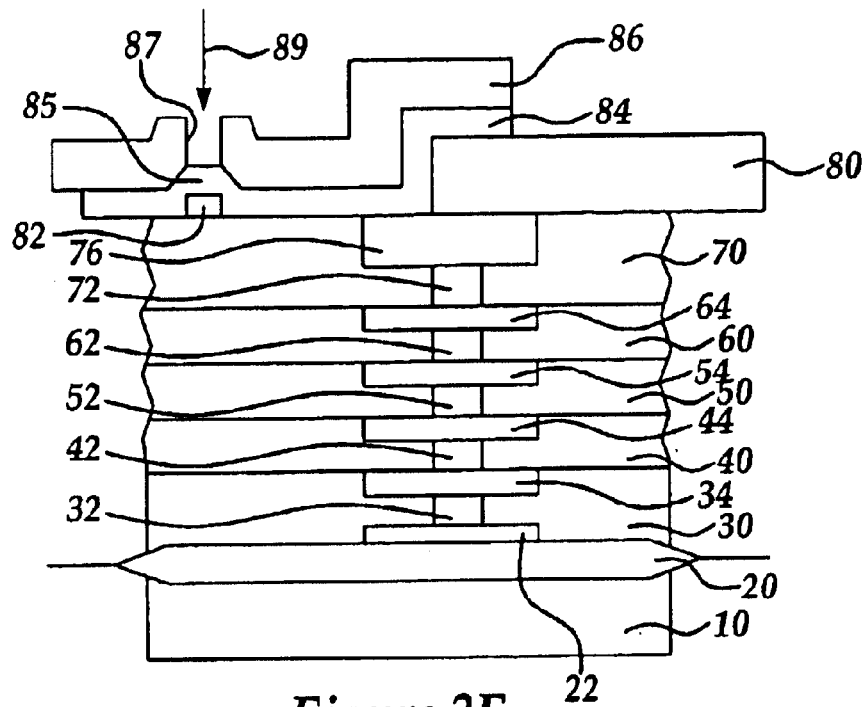
FIG. 3E illustrates a method of removing a portion of the passivation blanket to provide a fuse window in the passivation blanket overlying the metal fuse of the semiconductor device shown in FIG. 3D.
Figure 3F:
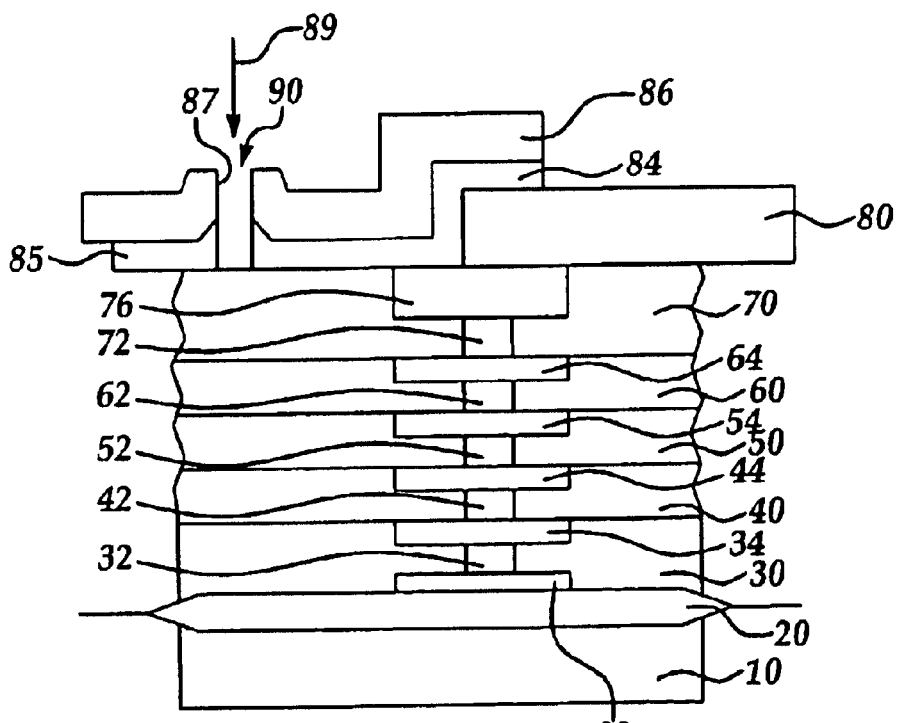
FIG. 3F illustrates a method of cutting the metal fuse in the semiconductor device shown in FIG. 3E.

As shown in FIG. 3E, a specific mask with conventional photolithography and etching techniques is utilized to pattern the passivation layers 84, 86, and selectively removing a portion thereof to provide an aluminum fuse window 87. The aluminum fuse window 87 extends through the passivation layer 86 so that a portion 85 of the bottom passivation layer 84 remains over the aluminum fuse 82. This produces a very shallow fuse window 87. Thereafter, electrical probing test is performed on the aluminum pad 80 to decide which defective cells or circuits need repair. A laser beam 89 is emitted through the aluminum fuse window 87 and penetrates through the remaining portion 85 of the passivation layer 84 to perform the laser repair. Next, the aluminum fuse 82 is cut open by the laser drilling, in a manner similar to that shown in FIG. 2F. An opening 90 exposes the top IMD layer 70 after the laser repair.

Figure 4A:
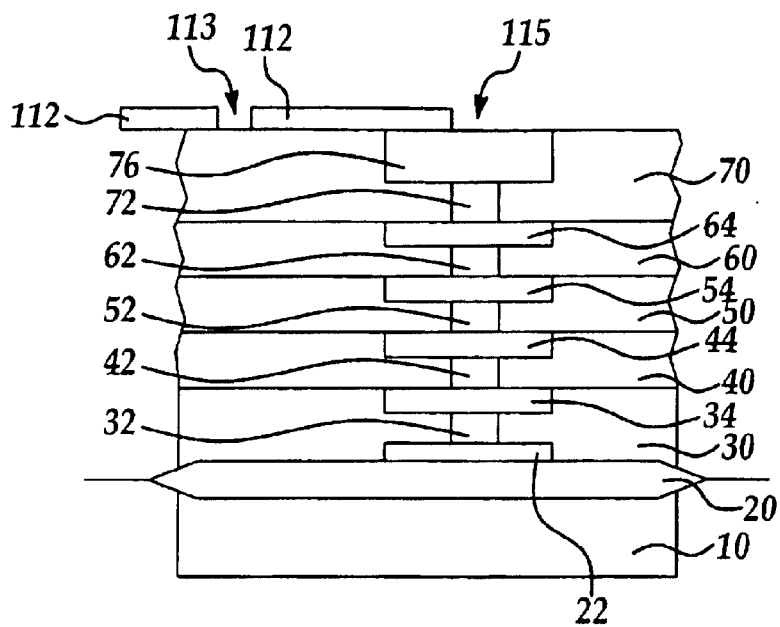
FIG. 4A illustrates a method according to the present invention including forming a sacrificial layer over a semiconductor device having a plurality of dielectric layers and metallization layers.
Figure 4B:
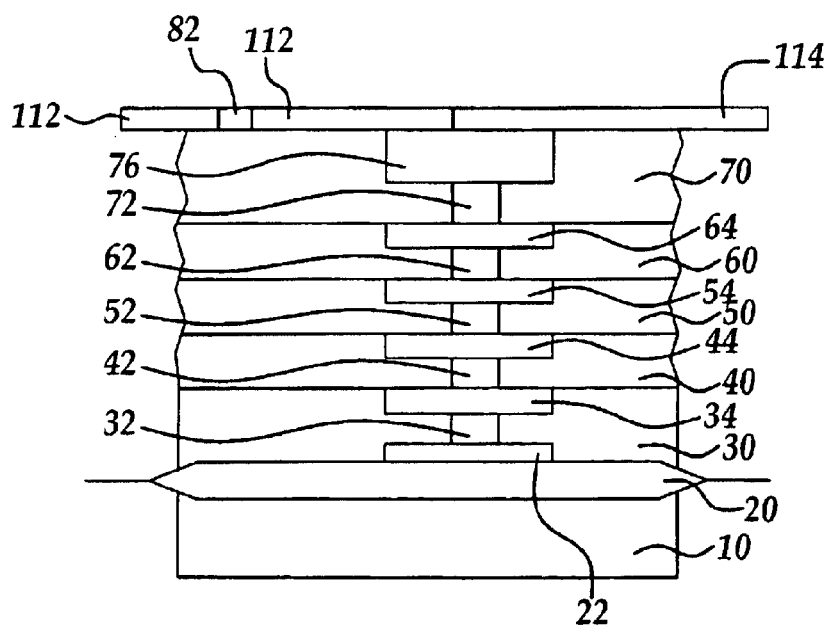
FIG. 4B illustrates a method according to the present invention of depositing an electrically conductive material into openings in the sacrificial layer to form a metal fuse and a first layer of a probing test pad.
Figure 4C:
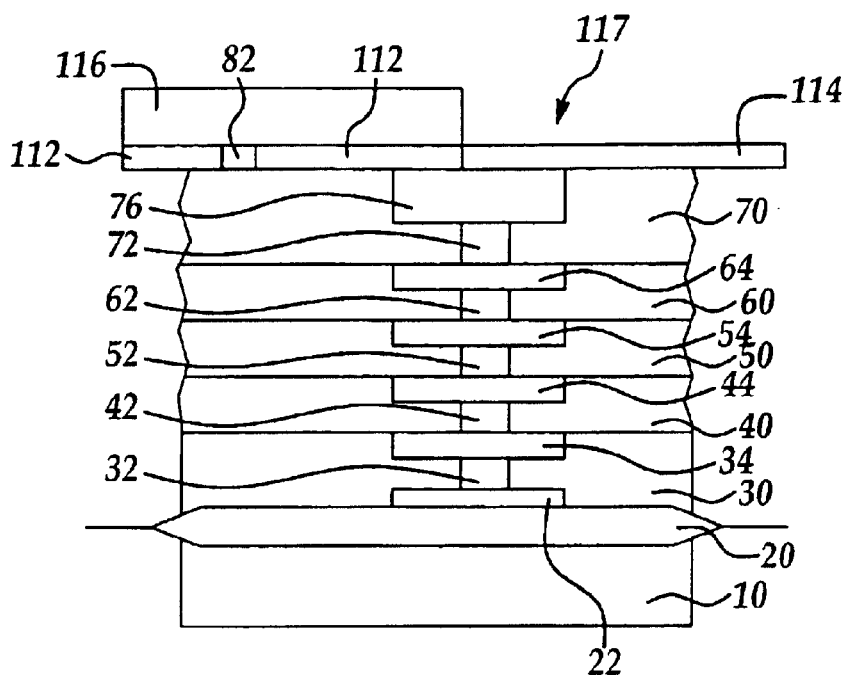
FIG. 4C illustrates a method according to the present invention including forming a second sacrificial layer over the first sacrificial layer and the metal fuse of the semiconductor device shown in FIG. 4B.
Figure 4D:
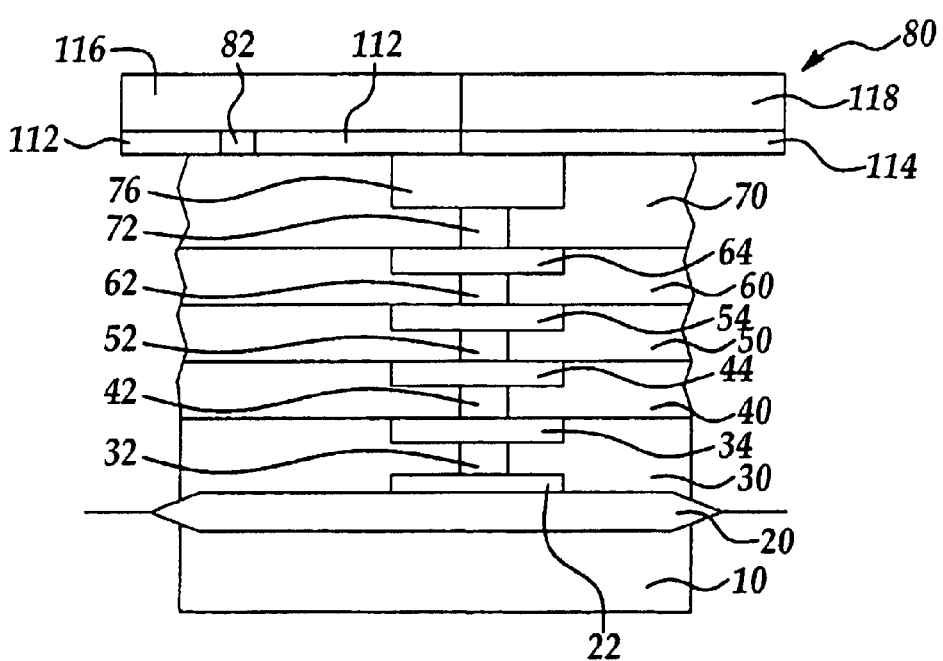
FIG. 4D illustrates a method according to the present invention including depositing a second layer of metal over the first layer of the probing test pad to form a probing test pad having a thickness substantially greater than the thickness of the metal fuse.
Figure 4E:
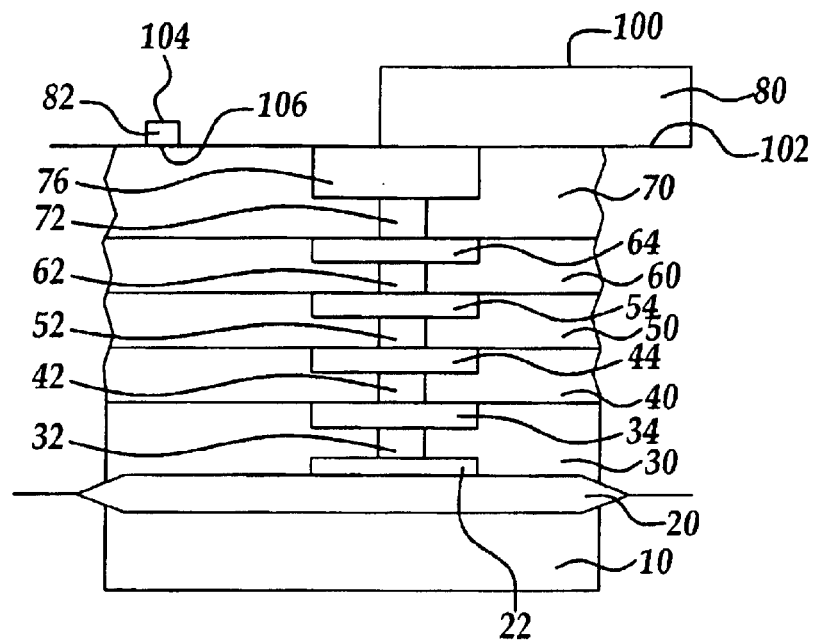
FIG. 4E illustrates a method according to the present invention including removing the first and second sacrificial layers to leave a metal fuse and a probing test pad on a semiconductor device having a plurality of dielectric layers and metallization layers.

FIGS. 4A–E illustrate another embodiment of the present invention. As shown in FIG. 4A, a first sacrificial layer 112 is provided over the top IMD layer 70 and over a portion of the top metallization layer 76 and includes openings 113, 115 therein in a manner known to those skilled in the art. The sacrificial layer 112 may be a photoresist layer that has been patterned and developed to provide the openings 113, 115. A shown in FIG. 4B, aluminum is deposited into the first opening 113 to form the aluminum fuse 82 and into the second opening 115 to form a first layer 114 of the aluminum pad 80. Thereafter, as shown in FIG. 4C, a second sacrificial layer 116 is provided over a portion of the first sacrificial layer 112 and the aluminum fuse 82 and the second sacrificial layer 116 includes an opening 117 therein overlying at least a portion of the first layer 114 of the aluminum pad 80. Then, as shown in FIG. 4D, a second layer of aluminum 118 is deposited over the first layer of aluminum 114 so that the first and second layers 114, 118 form the aluminum pad 80. Thereafter, as shown in FIG. 4E, the first and second sacrificial layers 112, 116 are removed leaving an aluminum fuse 82 and aluminum probing test pad 80. The aluminum fuse 82 and the aluminum probing test pad 80 have similar relative thicknesses with respect to each other as described above. Thereafter, the steps described with respect to FIGS. 3E–F may be performed on the structure shown in FIG. 4E.

Figure 5A:
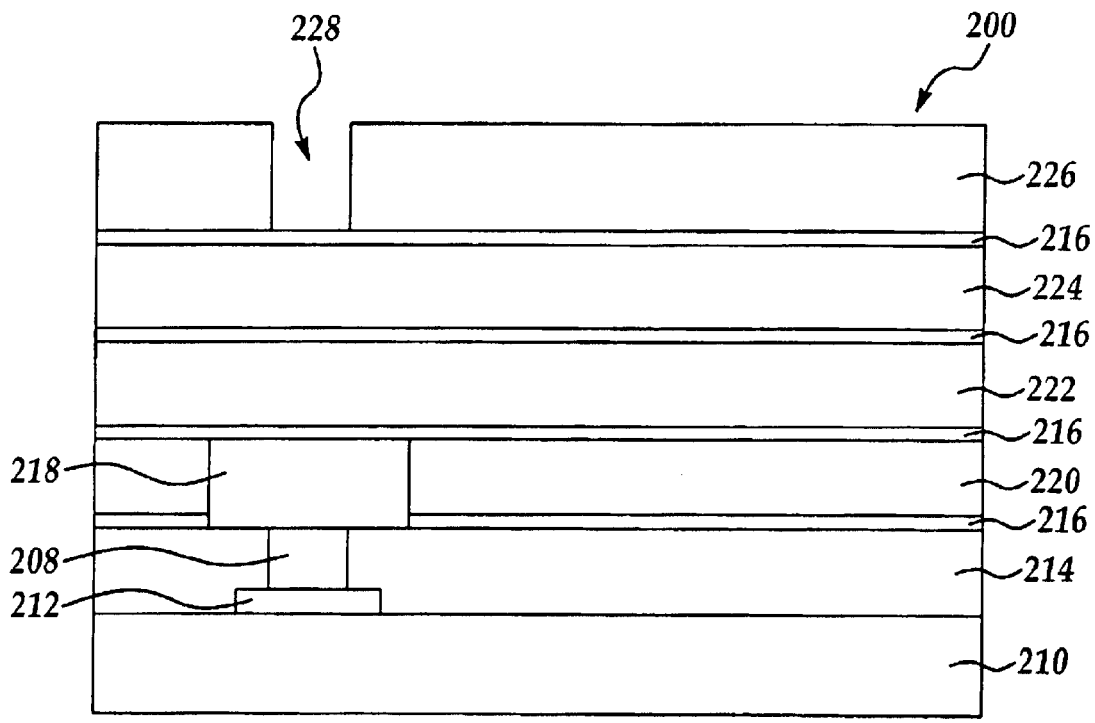
FIG. 5A illustrates a method of forming a first protective mask with an opening therethrough over a semiconductor device having at least a first metallization layer above a silicon based substrate and at least a first inter-metal dielectric layer overlying the first metallization layer.

FIGS. 5A–J illustrate another embodiment of a method according to the present invention. As shown in FIG. 5A, a semiconductor device 200 is provided similar to the previously described semiconductor devices. The semiconductor device 200 includes a silicon based substrate 210 which includes background doping and a number of discrete devices formed therein. An electrically conductive layer 212 may be formed over the silicon based substrate 210 and may be aligned with specific discrete devices therein (not shown). An inter-level layer dielectric 214 may be formed over the silicon based substrate 210. An electrically conductive plug 208 may extend through the inter-level dielectric 214 down to the electrically conductive layer 212. A silicon nitride layer 216 may be formed over the inter-level dielectric layer 214. A first metallization layer 218 is formed over the inter-level dielectric layer 214 connects to the electrically conductive plug 208. A second inter-metal dielectric 222 may be formed over the first metallization layer 218 and a third inter-level dielectric layer 224 may be formed over the second inter-metal dielectric layer 222. Silicon nitride layers (etch stop) 216 may be interposed between the various inter-metal dielectric layers. A first mask 226 is formed over the semiconductor device includes an opening 228 therein and aligned with a portion of the first metallization layer 218. The mask 226 may be made from a photoresist layer which has been selectively patterned and developed, or from a decal with an opening therein, in a manner known to those skilled in art.

Figure 5B:
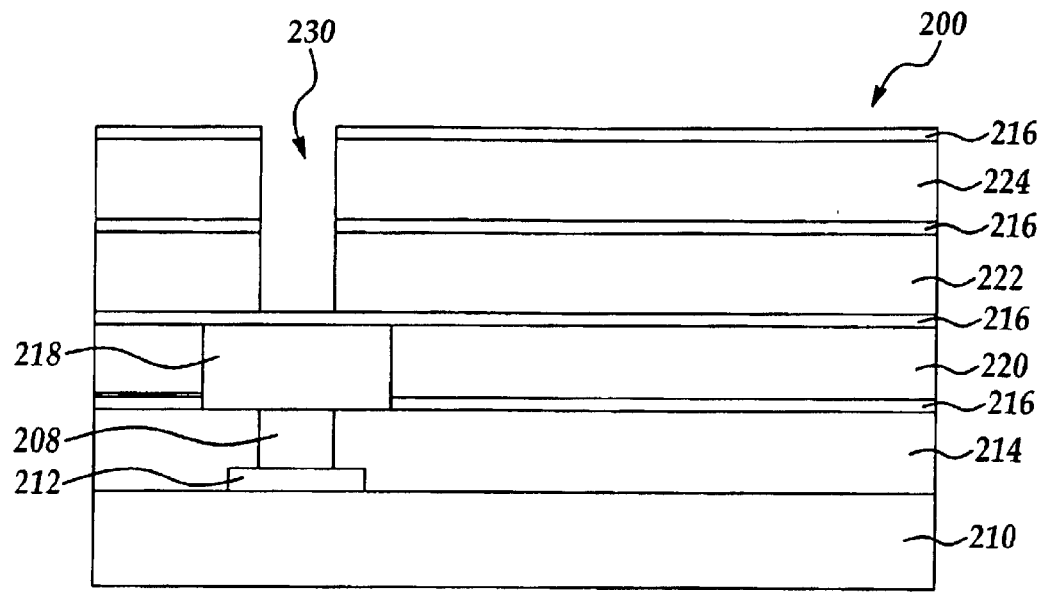
FIG. 5B illustrates a method of etching the semiconductor device through the opening in the first protective mask to provide a first via in the first inter-metal dielectric down to the first metallization layer and thereafter removing the first protective mask.
Figure 5C:
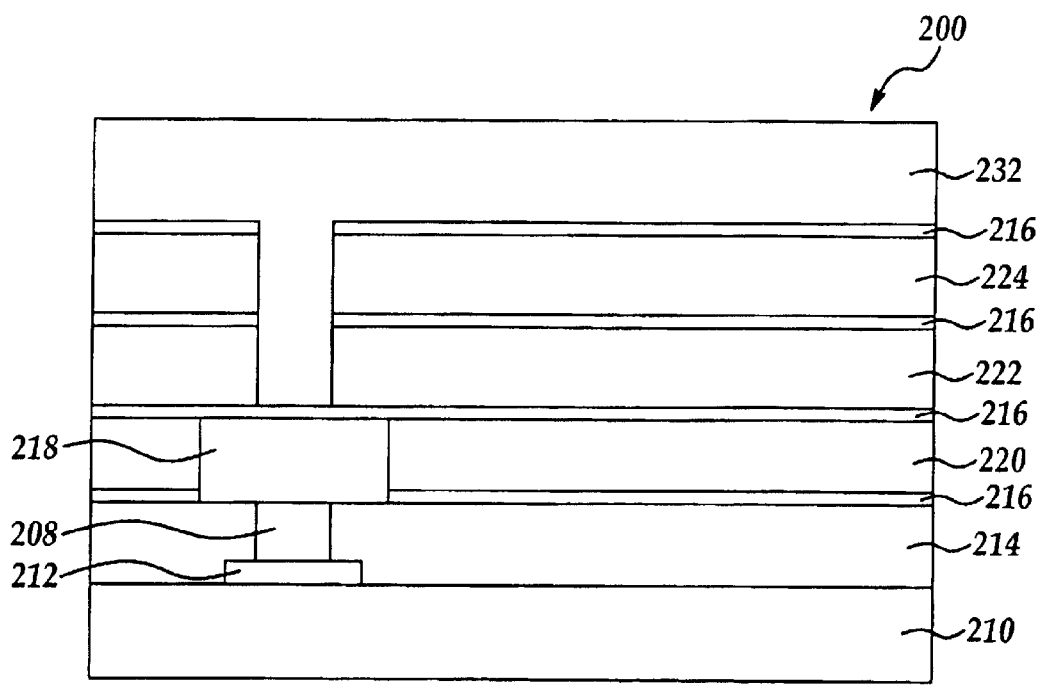
FIG. 5C illustrates a method of filling the first via with a plug.

As shown in FIG. 5B, the semiconductor device 200 is etched through the opening 228 in the first mask 226 (not shown), the third inter-metal dielectric layer 224, interposed layers 216 and etch stops (silicon nitride) or is etched through the interposed layer 216 above the first top metallization 218 to provide a via 230 down to the first metallization layer 218 or stopping just above the first metallization layer 218 on the interposed layer 216. The first mask 226 is then removed. As shown in FIG. 5C, then a second mask 232 (which may be a photoresist material) is formed over the semiconductor wafer and down into the opening (via) 232 overlying the first metallization layer 218. The second mask 232 may be a spin on photoresist layer.

Figure 5D:
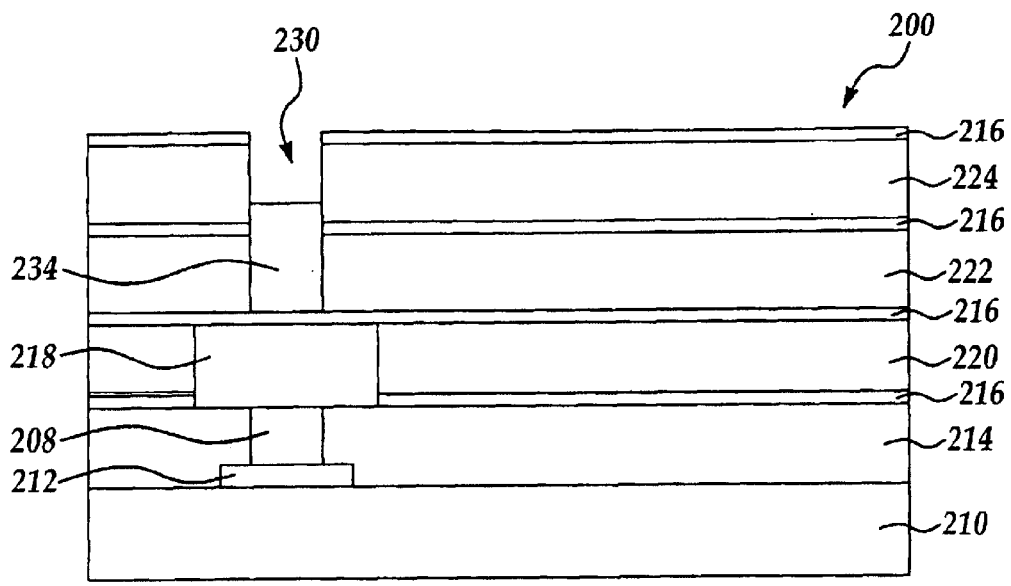
FIG. 5D illustrates a method of etching back the plug leaving a portion of the plug remaining in the first via.
Figure 5E:
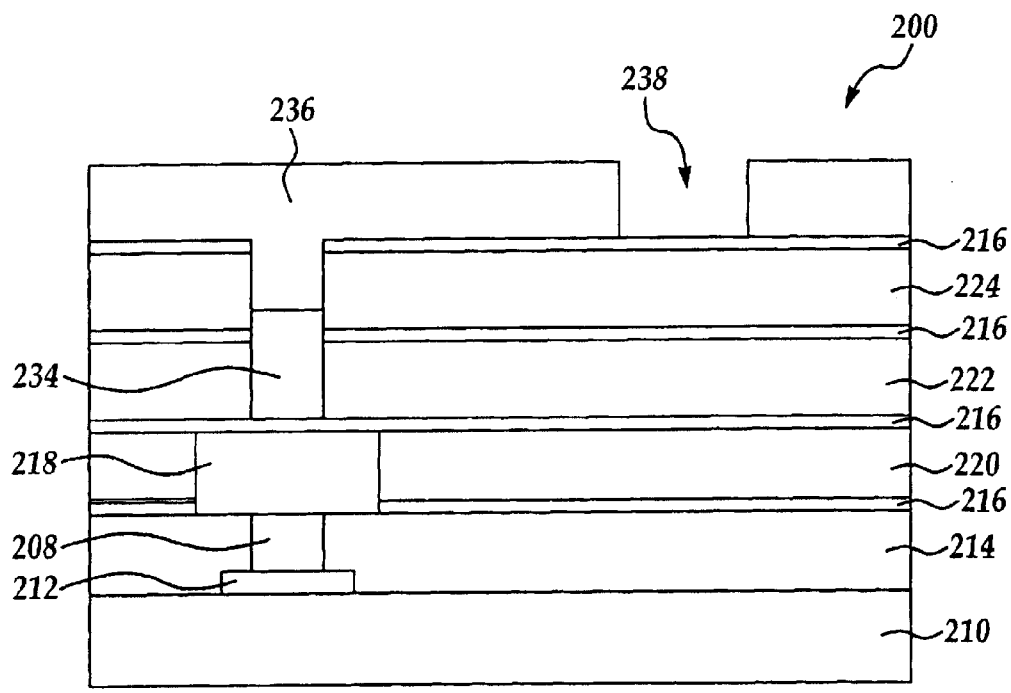
FIG. 5E illustrates a method of forming a second protective mask over the semiconductor device with a portion extending into the first via and having an opening in the second protective mask at a location laterally spaced from the first via and plug.
Figure 5F:
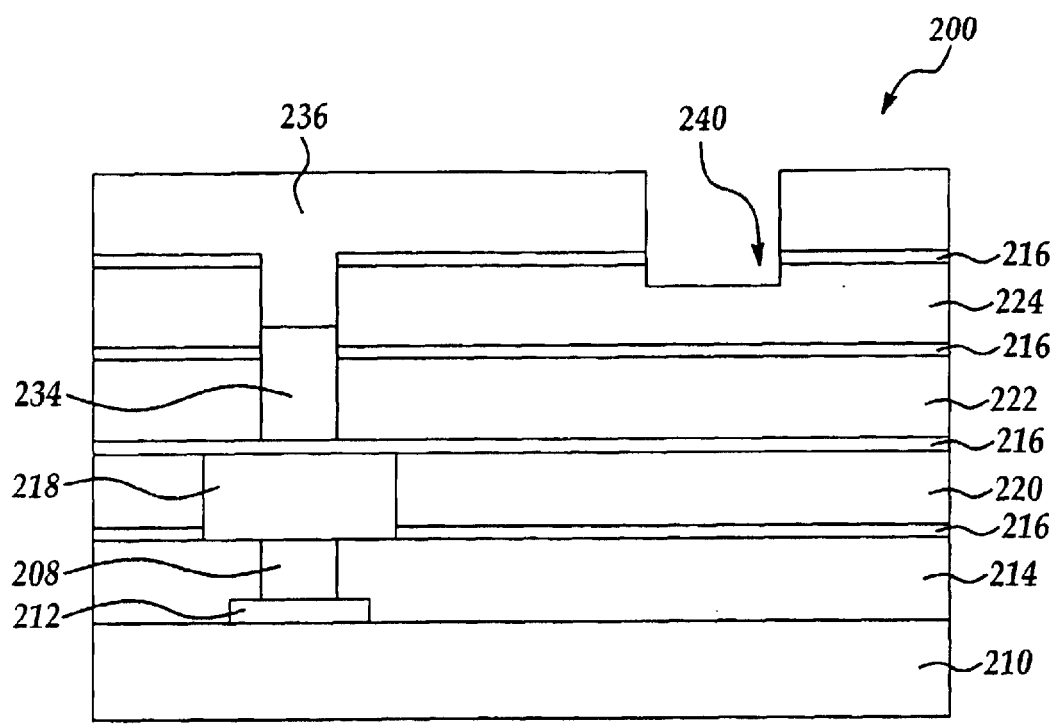
FIG. 5F illustrates a method of etching the semiconductor device through the opening in the second protective mask to for a second via in the first inter-metal dielectric, more shallow than the first via.

A shown in FIG. 5D, the photoresist layer 232 is then etched so as to leave a temporary plug 234 in the via 230 overlying the first metallization layer 218. As shown in FIG. 5E, a third mask 236 which may be a photoresist layer which is developed and patterned to form an opening 238 to a position which may be laterally spaced apart from the temporary plug 234 and top metallization layer 218. As shown in FIG. 5F, the semiconductor 200 is etched through the opening 238 to form a shallow via or cut 240 in the third inter-metal dielectric layer 224. The shallow via 240 extends a distance a distance less than 4500 angstroms, and preferably 1500–3000 angstroms from the top surface 243 of the third inter-metal dielectric 224. The via 240 will be filled with an electrically conductive material such as a metal to form a fuse which has a thickness ranging from 1500–4500 angstroms and which is substantially less than the thickness of prior art fuses which range from 9000–12,000 angstroms.

Figure 5G:
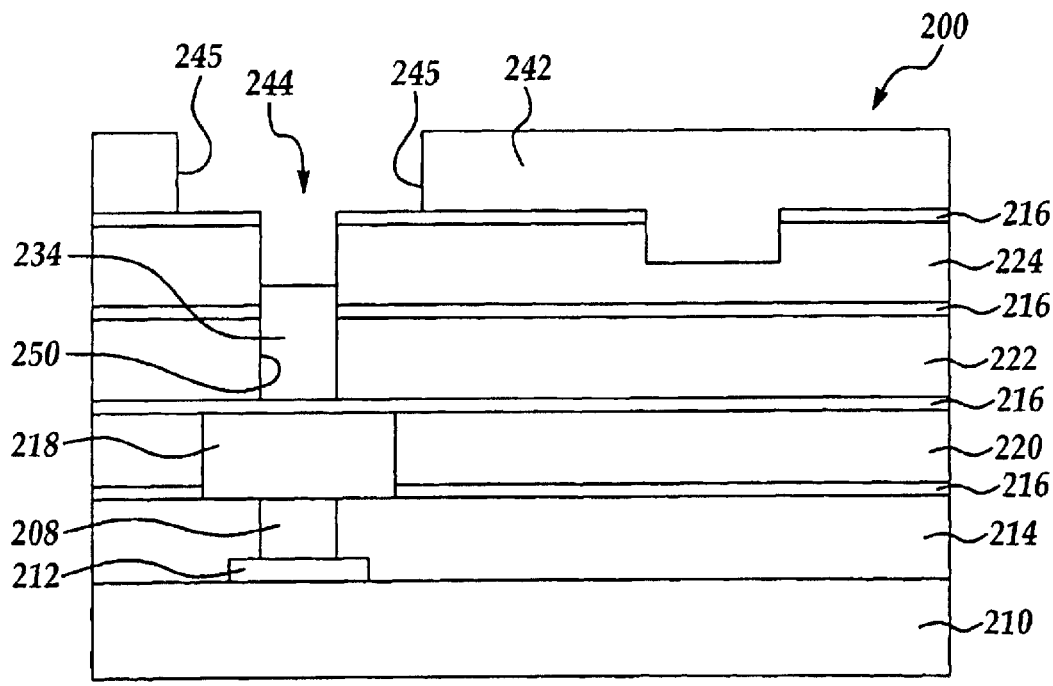
FIG. 5G illustrates a method of removing the second protective mask and forming a third protective mask over the semiconductor device with a portion extending down into the second via and having an opening in the third projective mask aligned with the first via.
Figure 5H:
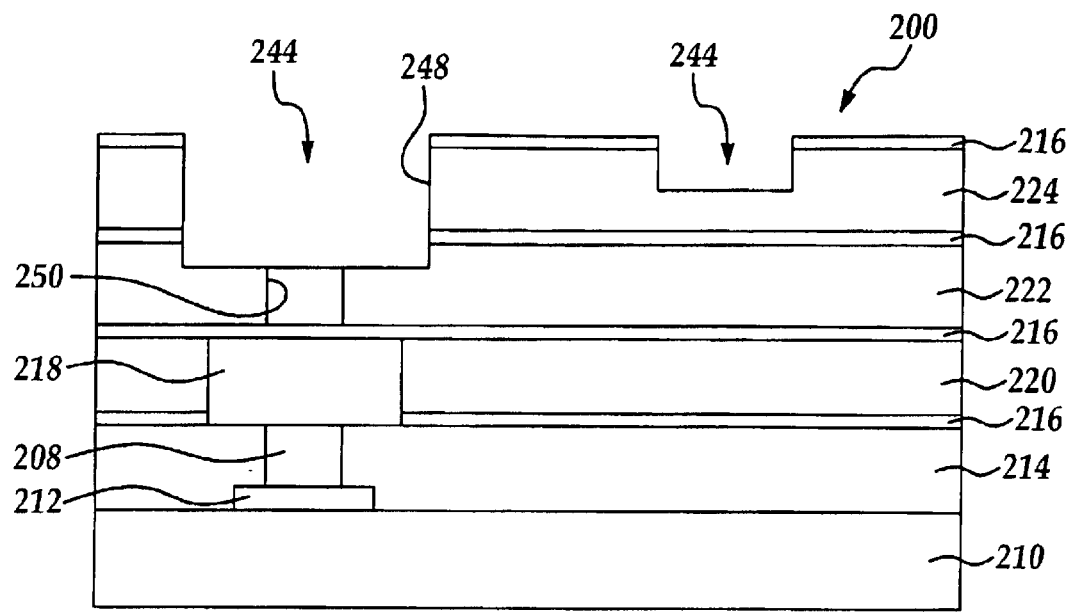
FIG. 5H illustrates a method of etching the semiconductor device through the opening in the third protective mask to remove the remaining portion of the plug and to provide an enlarged portion of the first via to receive a second metallization layer.

As shown in FIG. 5G, a fourth mask 242 which may be a photoresist layer with an opening 244 therein aligned with a portion of the first metallization layer 218 is formed over the semiconductor device 200. The opening 244 may have a cross-sectional area defined by walls 245 which is wider than the opening in the second inter-metal dielectric layer 222 defined by walls 250. As shown in FIG. 5H, the semiconductor device 200 is etched through the opening 244 in the fourth mask 242 preferably through the third inter-metal dielectric layer 224 down into the second inter-metal dielectric layer 222. The etching process provides a new via 246 in the semiconductor device 200. The new via 246 has a first portion defined by walls 248 which has a larger cross-sectional area than a second portion defined by walls 250. The new via 246 (stepped via) extends through the second and third inter-metal dielectric layers 222, 244 and through the etch stop interposed layers 216 all the way down to the first metallization layer 218.

Figure 5I:
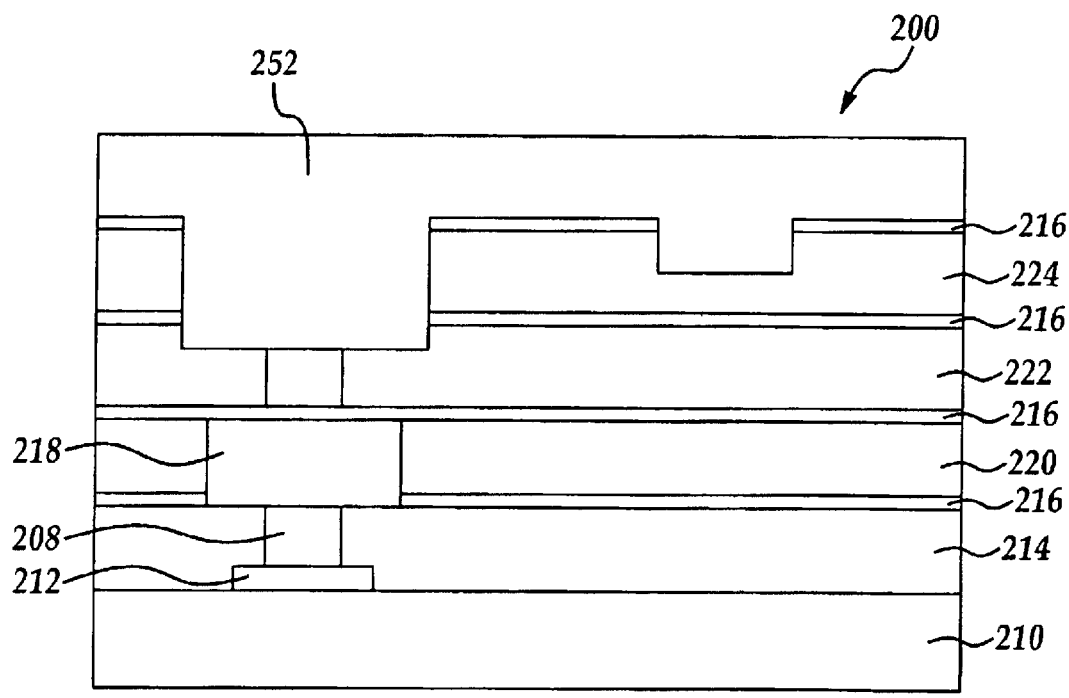
FIG. 5I illustrates a method of forming an electrically conductive material over the semiconductor device and down into the first via to the first metallization layer to provide a second metallization and a metal plug extending between the first metallization layer and the second metallization layer, and into the second via to provide a metal fuse.
Figure 5J:
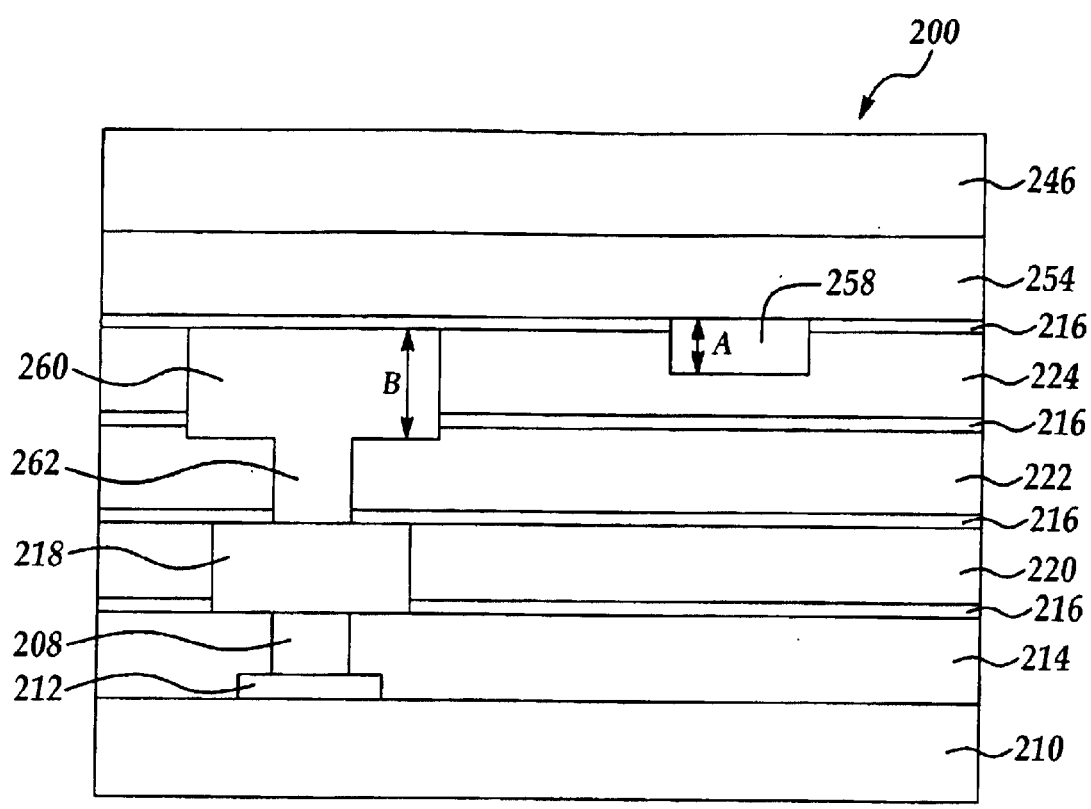
FIG. 5J illustrates a method of removing a portion of the electrically conductive material over the semiconductor device so the second metallization layer and the metal fuse each have a top surface in the same plane and so that the second metallization layer and the metal fuse are separated by the first interlayer dielectric, and further forming additional dielectric and protective layers over the semiconductor device.

As shown in FIG. 5I, an electrically conductive material 252 is formed over the semiconductor device and down into the via overlying the first metallization layer 218. The electrically conductive material 252 extends down into the via and makes contact with the first metallization layer 218 and also extends into the shallow via (cut) 240 formed in the third inter-metal dielectric layer 224. The electrically conductive material may be formed of any suitable material known to those skilled in the art including a metal such as aluminum, nickel, copper, and alloys and mixtures thereof, including AlCu and AlSiCu. As shown in FIG. 5J, the electrically conductive material 252 is then planarized, for example using chemical mechanical planarization techniques known to those skilled in the art, so that the top portion of the electrically conductive material 252 is removed down to the third inter-metallization dielectric layer 222 or the etch stop layer 216. If desired, first and second passivation layers 254, 256 may be formed over the semiconductor device as desired. The method according to the present invention provides a relatively thin fuse portion 258 having a thickness (as measured by line A) ranging from 1500–4500 angstroms, and preferably less than 3000 angstroms. The thin fuse portion 258 is much thinner than prior art fuse layers which range from 9000–12,000 angstroms. The process also produces a second metallization layer 260 and a plug portion 262 that extends down to the first metallization layer 218. The thin fuse portion 258 is much thinner than the thickness (as measured by line B) of the second metallization layer 260. In one embodiment, the electrically conductive material used to form the second metallization layer 260, plug 262 and fuse portion 258 comprises copper and the inter-metal dielectric layers comprise a low-k dielectric material having a dielectric constant less than silicon dioxide, for example benzocyclobutene.

When a first layer (or first structure) is described herein as "overlying" a second layer or second structure) it shall mean that the first layer (or first structure) is in direct physical contact with the second layer (or second structure) or additional layers or structures may be interposed between the first layer (or first structure) and the second layer (or second structure). When a first layer (or first structure) is described herein as being "electrically connected" to a second layer (or second structure) it shall mean that the first layer (or first structure) is in direct physical contact with the second layer (or second structure) or additional layers or structures may be interposed between the first layer (or first structure) and the second layer (or second structure) so that an electric path extends between the first layer (or first structure) and the second layer (or second structure).

What is claimed is:

1. A method comprising:

providing a semiconductor device including a semiconductor substrate and at least a first inter-level dielectric layer, a first metallization layer formed in the first inter-level dielectric layer, and a top inter-metal dielectric layer overlying the first inter-level dielectric layer;

forming an electrically conductive plug in the top inter-metal dielectric layer so that the plug is electrically connected to the first metallization layer;

separately forming a metal fuse in the top inter-metal dielectric layer; and forming a top metallization layer in the top inter-metal dielectric layer so that the metal fuse has a thickness less than the top metallization layer.

2. A method as set forth in claim 1 further comprising forming a passivation blanket over the metal fuse, top inter-metal dielectric layer and the top metallization layer; and removing portions of the passivation blanket overlying the metal fuse to form a fuse window over the metal fuse and leaving a portion of the passivation blanket overlying the metal fuse.

3. A method as set forth in claim 2 wherein the passivation blanket includes a first passivation layer overlying the top inter-metal dielectric, top metallization layer, and metal fuse, and a second passivation layer overlying the first passivation layer.

4. A method as set forth in claim 3 wherein the first passivation layer comprises silicon oxide.

5. A method as set forth in claim 3 wherein the second passivation layer comprises silicon nitride.

6. A method as set forth in claim 2 further comprising removing the remaining portion of the passivation blanket overlying the metal fuse.

7. A method as set forth in claim 6 further comprising cutting the metal fuse.

8. A method as set forth in claim 7 wherein the removing of the remaining portion of the passivation blanket overlying the metal fuse and the cutting of the metal fuse comprises removing the remaining portion and the passivation blanket and to cutting the metal fuse using a laser beam.

9. A method as set forth in claim 1 wherein the plug, top metallization layer, and metal fuse comprises copper.

10. A method as set forth in claim 9 further comprising a plurality of inter-layer dielectric layer each comprising a low dielectric constant material.

11. A method as set forth in claim 9 wherein the top inter-metal dielectric comprises silicon dioxide.

12. A method as set forth in claim 1 wherein the metal fuse comprises aluminum.

13. A method as set forth in claim 1 wherein at least one of the metal fuse and the probing test pad includes at least one of Al, AlCu, AlSiCu, Al alloys and mixtures thereof.

14. A method comprising:
providing a semiconductor device including a semiconductor substrate and at least a first inter-level dielectric layer, a first metallization layer formed in the first inter-level dielectric layer, and a top inter-metal dielectric layer overlying the first inter-level dielectric layer, a top metallization layer formed in the top inter-metal dielectric layer, and a plug formed in the top inter-metal dielectric layer electrically connecting the top metallization layer to the first metallization layer;
forming a probing test pad over the top metallization layer and metal fuse pre-structure over the top inter-metal dielectric layer, wherein the probing test pad and the metal fuse pre-structure have substantially the same thickness; and
removing portions of the metal fuse pre-structure to form a metal fuse having a thickness substantially less than the thickness of the probing test pad.

15. A method as set forth in claim 14 wherein the top metallization layer comprises copper and the probe test pad comprises aluminum.

16. A method as set forth in claim 15 wherein the metal fuse comprises aluminum.

17. A method as set forth in claim 14 wherein the removing of a portion of the metal fuse pre-structure comprises etching the metal fuse pre-structure.

18. A method as set forth in claim 14 further comprising forming a passivation blanket over the probing test pad and metal fuse.

19. A method as set forth in claim 18 further comprising removing portions of the passivation blanket to expose at least a portion of the probing test pad.

20. A method as set forth in claim 19 further comprising removing a portion of the passivation blanket overlying the metal fuse to form a metal fuse window and leaving a portion of the passivation blanket overlying the metal fuse.

21. A method as set forth in claim 20 further comprising removing the remaining portion of the passivation blanket overlying the metal fuse to expose the metal fuse.

22. A method as set forth in claim 21 further comprising cutting the metal fuse.

23. A method as set forth in claim 22 wherein the cutting of the metal fuse comprises burning the metal fuse with a laser beam.

24. A method as set forth in claim 21 wherein the removing of a portion of the passivation blanket to form a metal fuse window comprises vaporizing portions of the passivation blanket with a laser beam.

25. A method as set forth in claim 14 wherein the probing test pad includes at least one selected from the group consisting of aluminum, copper, silicon, aluminum alloys and mixtures thereof.

26. A method as set forth in claim 14 wherein the metal fuse includes at least one of aluminum, copper, silicon, aluminum alloys and mixtures thereof.

27. A method as set forth in claim 14 wherein the metal fuse and the probing test pad each comprises at least one of Al, AlCu, AlSiCu, Al alloys and mixtures thereof.

28. A method comprising:
providing a semiconductor device including a semiconductor substrate and at least a first inter-metal dielectric layer, a first metallization layer formed in the first inter-metal dielectric layer, and a top inter-metal dielectric layer overlying the first inter-metal dielectric layer, a top metallization layer formed in the top inter-metal dielectric layer, and a plug formed in the top inter-metal dielectric layer electrically connecting the top metallization layer to the first metallization layer;
forming a first layer of a probing test pad over the top metallization layer and a metal fuse over the top inter-metal dielectric layer, wherein the first layer of the probing test pad and the metal fuse have substantially the same thickness; and
form a second layer of the probing test pad over the first layer of the probing test pad so that the first and second layers of the probing test pad together have a thickness greater than the thickness of the metal fuse.

29. A method as set forth in claim 28 wherein the top metallization layer comprises copper and the probing test pad comprises aluminum.

30. A method as set forth in claim 29 wherein the metal fuse comprises aluminum.

31. A method as set forth in claim 29 further comprising forming a passivation blanket over the probing test pad and the metal fuse.

32. A method as set forth in claim 31 further comprising removing portions of the passivation blanket to expose at least a portion of the probing test pad.

33. A method as set forth in claim 32 further comprising removing a portion of the passivation blanket overlying the metal fuse to form a metal fuse window and leaving a portion of the passivation blanket overlying the metal fuse.

34. A method as set forth in claim 33 further comprising removing the remaining portion of the passivation blanket overlying the metal fuse to expose the metal fuse.

35. A method as set forth in claim 34 further comprising cutting the metal fuse.

36. A method as set forth in claim 35 wherein the cutting of the metal fuse comprises burning the metal fuse with a laser beam.

37. A method as set forth in claim 34 wherein the removing of a portion of the passivation blanket to form a metal fuse window comprises vaporizing portions of the passivation blanket with a laser beam.

38. A method as set forth in claim 28 wherein the probing test pad includes at least one of aluminum, copper, silicon, aluminum alloys and mixtures thereof.

39. A method as set forth in claim 28 wherein the metal fuse includes at least one of aluminum, copper, silicon, aluminum alloys and mixtures thereof.

40. A method as set forth in claim 28 wherein the metal fuse and the probing test pad comprises at least one of Al, AlCu, AlSiCu, Al alloys and mixtures thereof.

41. A method as set forth in claim 28 wherein the probing test pad has a thickness of at least 8000 angstroms.

* * * * *